(12) United States Patent
Percey

(10) Patent No.: US 6,400,735 B1
(45) Date of Patent: Jun. 4, 2002

(54) GLITCHLESS DELAY LINE USING GRAY CODE MULTIPLEXER

(75) Inventor: Andrew K. Percey, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/102,704

(22) Filed: Jun. 22, 1998

(51) Int. Cl.[7] .................................................. H04J 3/06

(52) U.S. Cl. ........................ 370/518; 370/532; 327/407; 708/301

(58) Field of Search ................................ 327/407, 276; 370/532, 537, 516, 517, 518; 708/301–425, 316; 375/371, 372

(56) References Cited

U.S. PATENT DOCUMENTS 5,465,076 A    11/1995   Yamauchi et al.
5,977,805 A   * 11/1999   Vergnes et al. ............. 327/107

FOREIGN PATENT DOCUMENTS

JP           5-191233      7/1993

* cited by examiner

*Primary Examiner*—Chau Nguyen
*Assistant Examiner*—D. Trinh
(74) *Attorney, Agent, or Firm*—Edward S. Mao

(57) ABSTRACT

A glitchless delay line using a Gray code multiplexer is provided. The glitchless delay line combines a multi-tap delay circuit with the Gray code multiplexer. Specifically, the multi-tap delay circuit provides a plurality of sequentially ordered delayed output signals on a plurality of sequentially ordered output terminals. The Gray code multiplexer has a plurality of input terminals coupled to the sequentially ordered delayed output terminals. The Gray code multiplexer is controlled by driving a Gray code value onto the control terminals of the Gray code multiplexer to select a specific delayed output terminal of the multi-tap delay circuit. The delay provided by the delay line is increased by incrementing the Gray code value on the control terminals of the Gray code multiplexer and decreased by decrementing the Gray code value on the control terminals. Race conditions on the control lines are eliminated when incrementing or decrementing the Gray code value by one.

17 Claims, 11 Drawing Sheets

US 6,400,735 B1

GLITCHLESS DELAY LINE USING GRAY CODE MULTIPLEXER

CROSS-REFERENCE TO RELATED APPLICATIONS

This application relates to U.S. Pat. No. 6,204,710, entitled "Precision Trim Circuit for Delay Lines", which is incorporated Herein by reference.

FIELD OF THE INVENTION

The present invention relates to delay lines for digital systems. More specifically, the present invention relates to a tuneable and glitchless delay line.

BACKGROUND OF THE INVENTION

Delay lines are used in digital circuits such as board level systems and integrated circuit (IC) devices, including field programmable gate arrays (FPGAs) and microprocessors, to control the timing of various signals in the digital circuits. A simple delay line receives an input signal on an input terminal and provides an output signal on an output terminal, the output signal being a copy of the input signal delayed by a certain time period that is referred to as the delay D of the delay line. More complicated delay lines are tuneable so that delay D of the delay line can be adjusted.

An IC device such as an FPGA can use a tuneable delay line to synchronize clock signals in various parts of the FPGA. As shown in FIG. 1, a circuit board 100 comprises an FPGA 105 and another IC device 150. FPGA 105 comprises a delay line 110 and configurable logic circuits 130. Clock signal CLK1 is coupled to an input terminal of delay line 110 and to the clocked circuits (not shown) of IC device 150. Delay line 110 drives a clock signal CLK2 to configurable logic circuits 130. Before clock signal CLK2 reaches configurable logic circuits 130, clock signal CLK2 may be skewed by various factors such as capacitance, heavy loading on the clock line, and propagation delay. The various skewing factors are represented by clock skew 140 which causes a skew delay on clock signal CLK2. To distinguish clock signal CLK2 from the skewed version of clock signal CLK2, the skewed version is referred to as skewed clock signal S_SLK2. Skewed clock signal S_SLK2 drives the clock input terminals (not shown) of the clocked circuits within configurable logic circuits 130. For proper operation of FPGA 105 with IC device 150, clock signal CLK1 should be synchronized with skewed clock signal S_SLK2. Clock signal CLK1 can be synchronized with skewed clock signal S_CLK2 by adjusting delay line 110 so that delay D plus skew delay S_D is equal to a multiple of the period of clock signal CLK1. Various circuits and methods of using delay lines to synchronize clock signals are well known in the art.

FIG. 2 shows a block diagram of a conventional tuneable delay line 200. Tuneable delay line 200 comprises a multi-tap delay circuit 210 and a multiplexer 220. Multi-tap delay circuit 210 is configured to receive an input signal IN and provide a plurality of delayed output signals D_O[0] to D_O[N] (also called taps). Each output signal is a copy of input signal IN delayed by some multiple of a basic delay of tuneable delay line 210. Specifically, delayed output signal D_O[0] is a copy of input signal IN delayed by zero times the basic delay, (i.e. not delayed). Delayed output signal D_O[1] is a copy of input signal IN delayed by the basic delay. Delay output signal D_O[2] is a copy of input signal IN delayed by two times the basic delay. In general, delayed output signal D_O[X] is a copy of input signal IN delayed by X times the basic delay. Some multi-tap delay circuits 210 may not provide delayed output signal D_O[0].

Multiplexer 220 is configured to receive some or all of the delayed output signals. Thus, the input terminals of multiplexer 220 are coupled to the output terminals of multi-tap delay circuit 210. To avoid confusion, terminals are referred to with the same identifier as the signals driven by the terminal. For example, delayed output signal D_O[2] is driven by output terminal D_O[2]. Multiplexer 220 is controlled by tap select signals TS[0–M]. As used herein, signals that logically form groups are referred to using a group name followed by brackets enclosing a number for each signal. If more than one signal is referred to simultaneously, brackets containing a range of numbers are used. For example tap select signals TS[0–M] comprise M+1 signals TS[0], TS[1], TS[2]. . . TS[M–1], and TS[M]. Tap select lines TS[0–M] select which delayed output signal multiplexer 220 drives output terminal OUT.

FIG. 3A is a block diagram that illustrates multi-tap delay circuit 210 in more detail. The delay circuit of FIG. 3A comprises a plurality of delay elements 310_0 to 310_N–1. Delay elements 310_1 to 310_N–1 are coupled in series so that the input terminal of a delay element 310_X is coupled to the output terminal of a delay element 310_X–1, where X is an integer from 1 to N–1. The input terminal of delay element 310_0 is coupled to input terminal IN of multi-tap delay circuit 210. Each delay element 310_X drives a delayed output signal D_O[X+1]. Delayed output signal D_O[0] is provided at the input terminal of delay element 310_0. Typically, each delay element is identical and provides a delay equal to the base delay. Thus, each delayed output signal D_O[X] is delayed by the base delay from the previous delayed output signal D_O[X–1].

FIG. 3B shows a typical delay element 350. Delay element 350 comprises an inverter 351 coupled in series with an inverter 352. Logically, inverter 351 and inverter 352 cancel out. However, both inverter 351 and inverter 352 provide a small propagation delay. Thus, for delay element 350 the base delay is equal to the propagation delay of inverter 351 plus the propagation delay of inverter 352. Other types of delay elements are also well known in the art and can be used in multi-tap delay circuits.

As explained above, multiplexer 220 (FIG. 2) selects a delayed output signal from multi-tap delay circuit 210 to drive output terminal OUT. However, conventional multiplexers sometimes produce glitches due to race conditions on select lines TS[0–M]. For example, FIG. 4 is a circuit diagram illustrating a version of multiplexer 220, where N=16. To switch from delayed output signal D_O[7] to delayed output signal D_O[8], tap select signals TS[0–3] must transition from 0111 (binary) to 1000 (binary). During the transition from 0111 to 1000, tap select signals TS[0–3] may transition temporarily to 1111, which would temporarily select delayed output signal D_O[15]. For example, if delayed output signal D_O[15] is at a logic high level while the desired delayed output signal D_O[8] is at a logic low level, a glitch appears on output signal OUT. If delay line 200 is being used for synchronizing clock signals as shown in FIG. 1, the temporary transition to the logic high level caused by the glitch may erroneously trigger clocked elements of configurable logic circuits 130, thereby causing FPGA 100 to perform erroneously. Hence, there is a need for a tuneable delay line that provides glitchless operation.

SUMMARY OF THE INVENTION

The invention provides a tuneable delay line that uses a unique Gray code multiplexer to select the appropriate delayed output signal without glitches by eliminating race conditions on the multiplexer select signals. The invention takes advantage of the fact that the delay line settings change in an ordered fashion, i.e., the settings are sequentially ordered. Specifically, in one embodiment of the present invention a delay line comprises a multi-tap delay circuit that generates a plurality of sequentially ordered delayed output signals on a plurality of sequentially ordered delayed output terminals. The input terminals of a Gray code multiplexer are coupled to the sequentially ordered output terminals of the multi-tap delay circuit. The Gray code multiplexer routes one of the delayed output signals to an output terminal in response to a Gray code value applied to the Gray code control terminals of the Gray code multiplexer.

The delay provided by the delay line is adjusted by increasing or decreasing the Gray code value applied to the Gray code control terminals of the Gray code multiplexer. Specifically, to increase the delay provided by the delay line by one base delay, the Gray code value applied to the Gray code control terminals of the Gray code multiplexer is increased by one. Conversely, to decrease the delay provided by the delay line by one base delay, the Gray code value applied to the Gray code control terminals of the Gray code multiplexer is decreased by one.

One embodiment of the Gray code multiplexer is implemented using a multiplexer tree having a first level and a last level. The last level is a first multiplexer having a first input terminal and a second input terminal. The first level of the multiplexer tree includes a second multiplexer and a third multiplexer. The second multiplexer has an output terminal coupled to the first input terminal of the first multiplexer, and a plurality of sequentially ordered input terminals coupled to a first subset of the sequentially ordered delayed output terminals of the multi-tap delay circuit. The third multiplexer has an output terminal coupled to the second input terminal of the first multiplexer, and a plurality of sequentially ordered input terminals reversedly coupled to a second subset of sequentially ordered delayed output terminals of the multi-tap delay circuit. The reverse coupling of the sequentially ordered input terminals of the third multiplexer allows the Gray code to be implemented, since adjacent settings have addresses that differ by only one bit.

The present invention will be more fully understood in view of the following description and drawings.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

Figure 1:
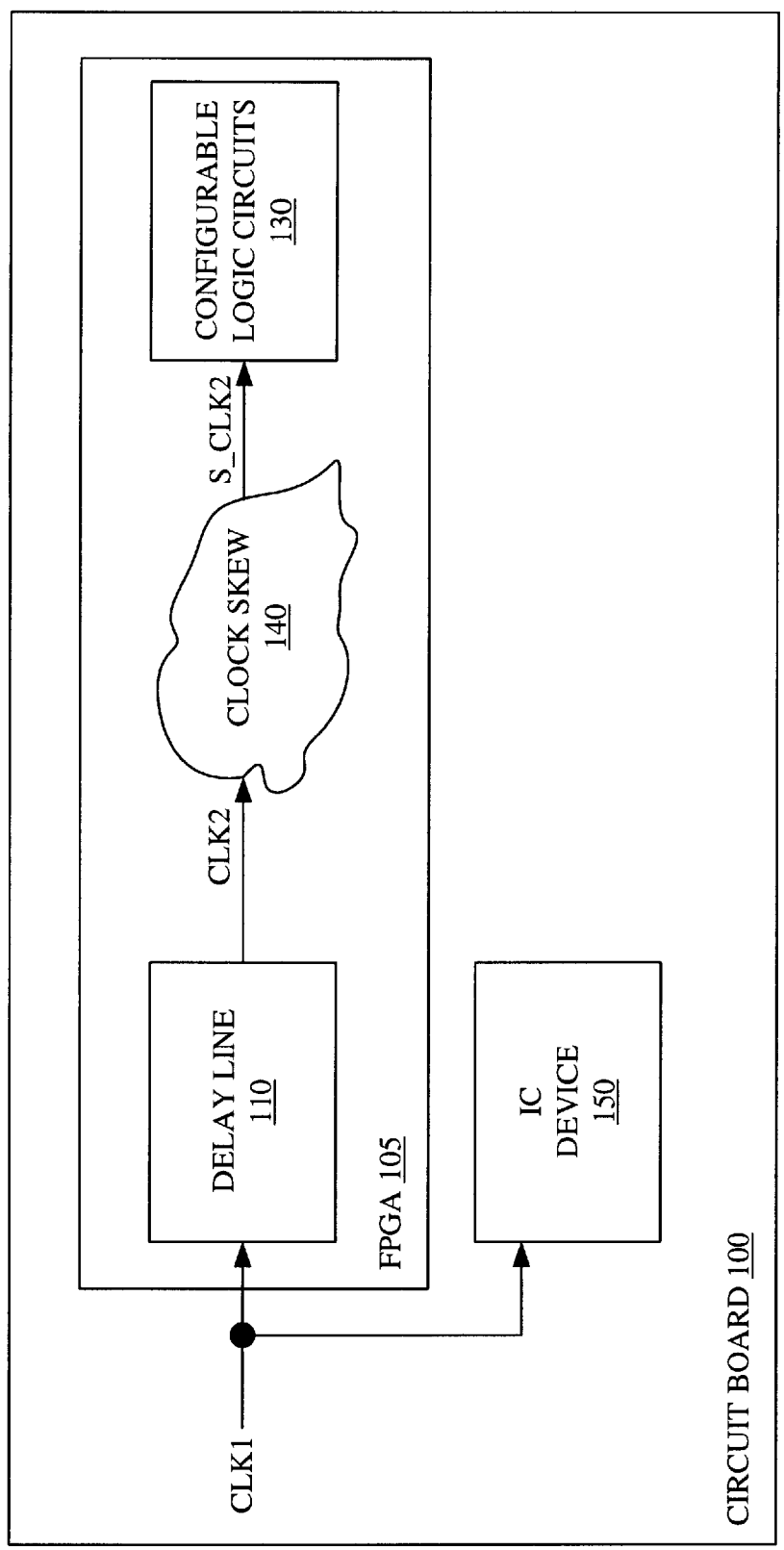
FIG. 1 is a block diagram of a circuit board using an FPGA with an internal delay line.
Figure 2:
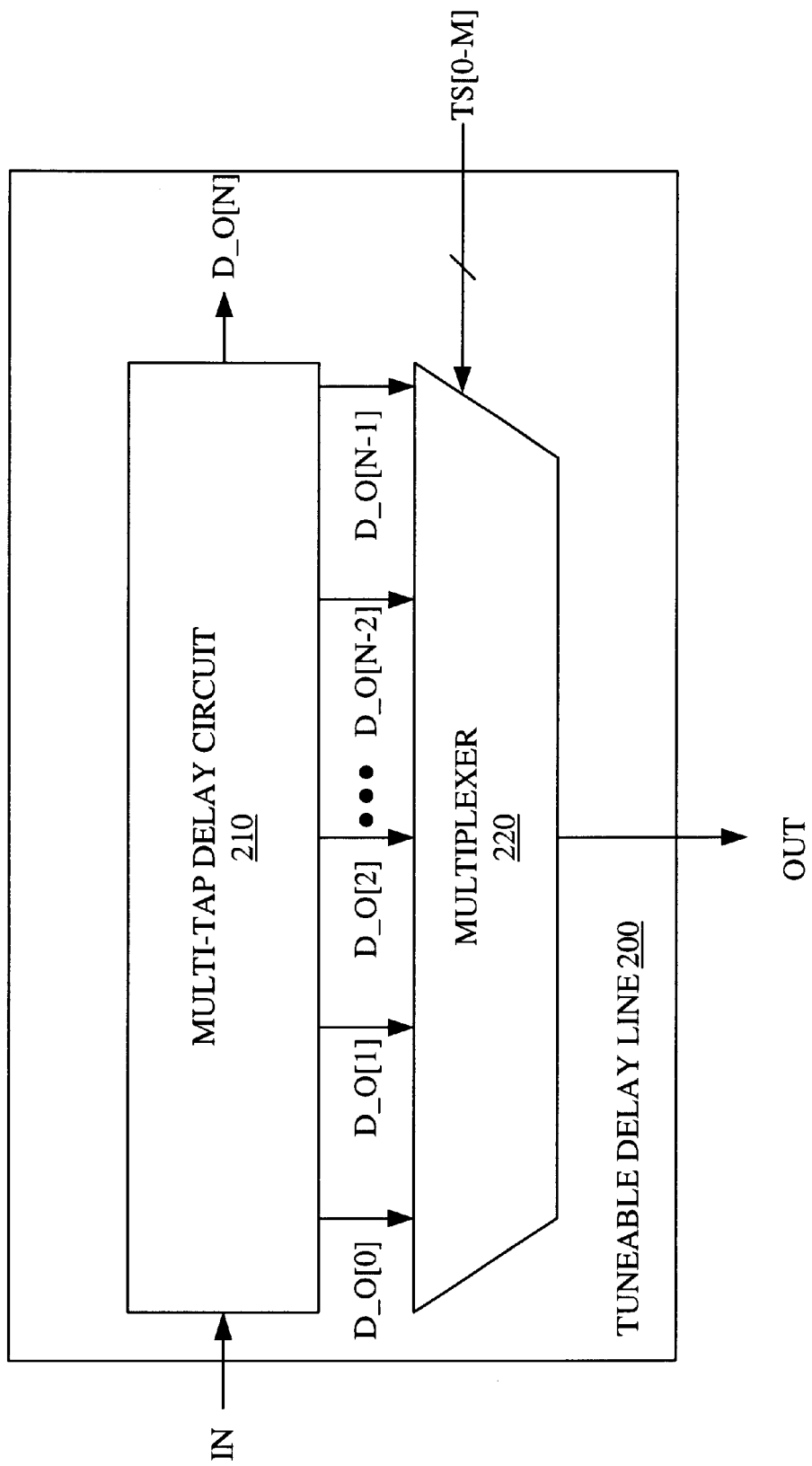
FIG. 2 is a block diagram of a conventional tuneable delay line.
Figure 3A:
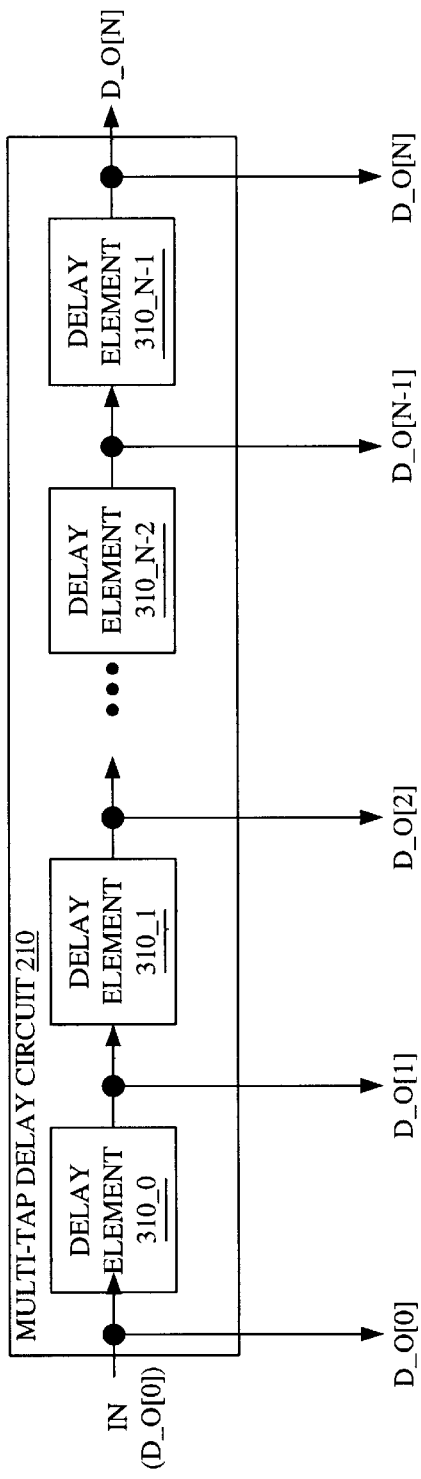
FIG. 3A is a block diagram of a conventional multi-tap delay circuit.
Figure 3B:
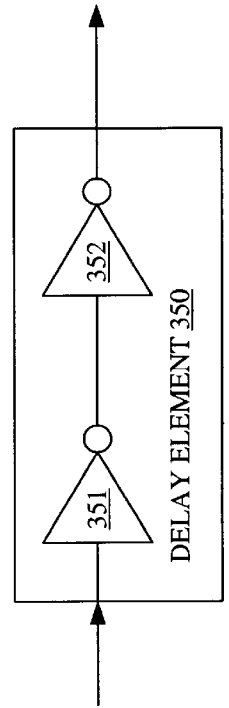
FIG. 3B is a schematic diagram of a conventional delay element.
Figure 4:
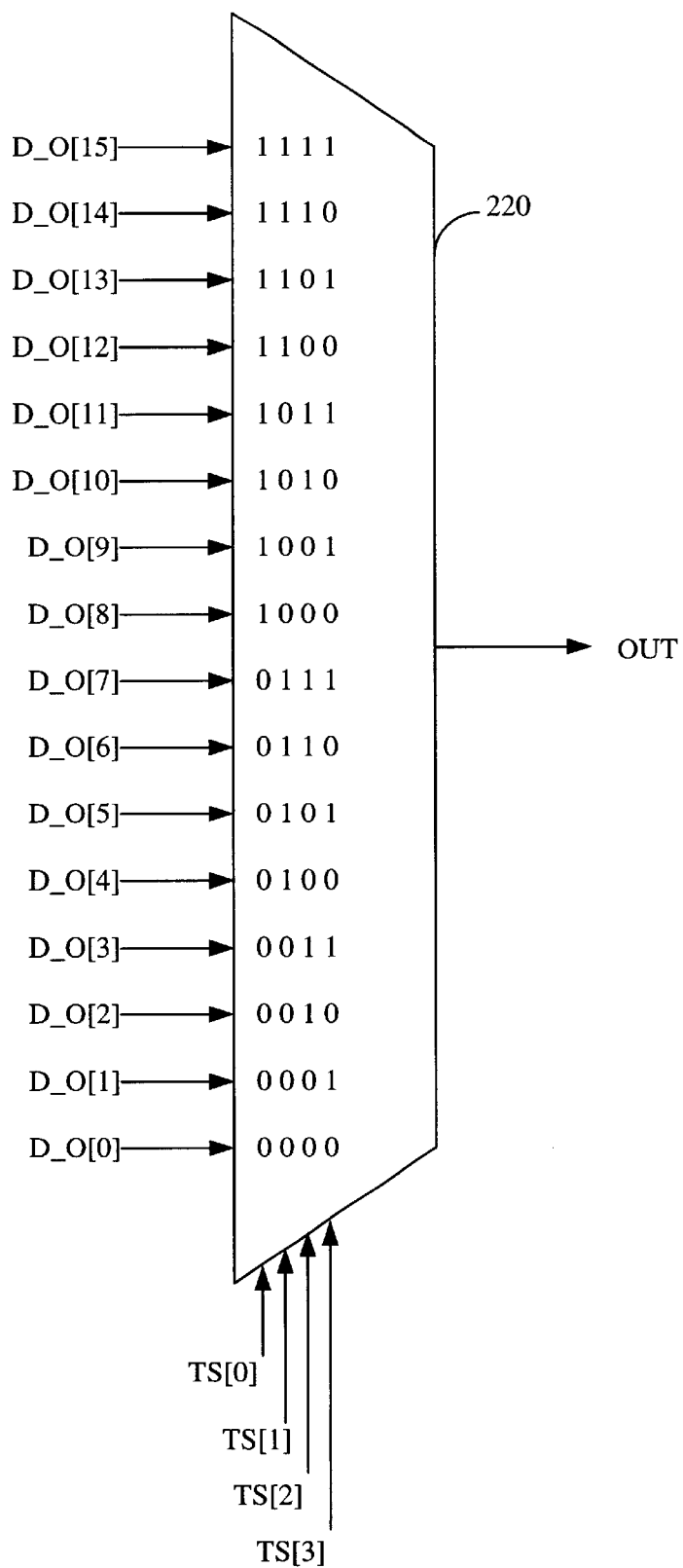
FIG. 4 is a schematic diagram of a conventional 16-input multiplexer.
Figure 5:
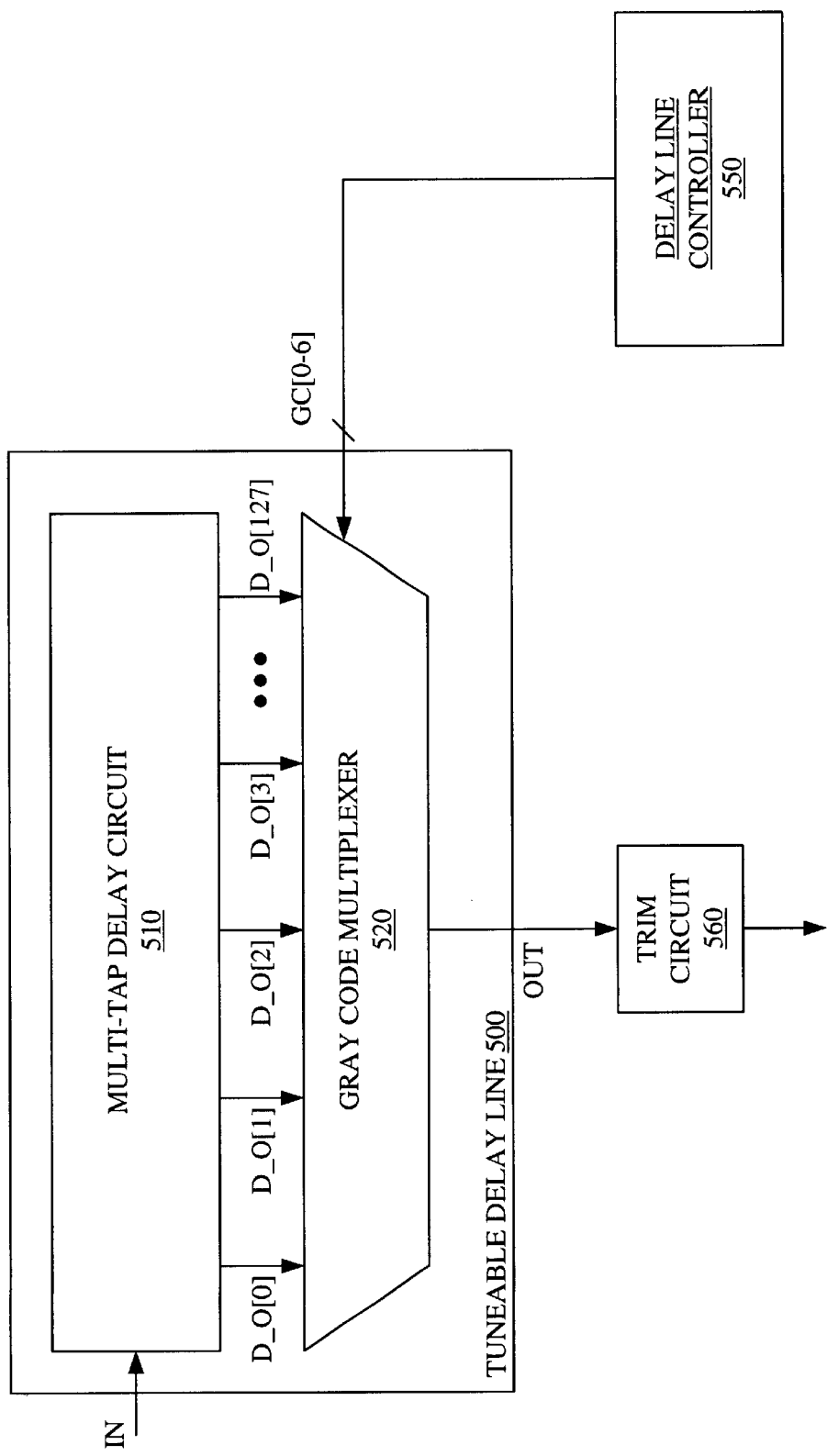
FIG. 5 is a block diagram of a tuneable delay line in accordance with one embodiment of the present invention.

FIG. 5 is a block diagram of a tuneable delay line 500 coupled to a delay line controller 550 and an optional trim circuit 560 in accordance with one embodiment of the present invention. For clarity, a specific embodiment of tuneable delay line 500 used for synchronizing clock signals is described herein. The embodiment described uses a multi-tap delay circuit 510 that comprises 128 delay elements and a Gray code multiplexer 520 having 128 sequentially ordered input terminals, seven Gray code control terminals, and one output terminal. Those skilled in the art can use the principles of the present invention described herein in other delay line applications using any number of delay elements.

Tuneable delay line 500 has an input terminal IN, an output terminal OUT, and Gray code control input terminals GC[0–6]. A delay line controller 550 drives Gray code control signals GC[0–6] to tuneable delay line 500. The embodiment of FIG. 5 uses a seven-bit Gray code control scheme because multi-tap delay circuit 510 provides 128 delayed output signals. In general, G Gray code control signals are needed for D delayed output signals, where G equals the smallest positive integer greater than or equal to the log base two of D. For the specific embodiment described herein, log base two of 128 is equal to seven. Thus, delay line controller 550 drives seven Gray code control signals. Some embodiments of tuneable delay line 500 incorporate delay line controller 550 within tuneable delay line 500. In these embodiments, tuneable delay line 500 can be controlled using control signals other than the actual Gray code value. One such set of control signals is described below in conjunction with FIG. 6.

Output terminal OUT of tuneable delay line 500 is coupled to an optional trim circuit 560. As is well known in the art, trim circuits are often used with delay lines to provide delays smaller than the base delay of a delay line. Embodiments of the present invention can be used with a trim circuit such as the one described by Goetting et al in U.S. Pat. No. 6,204,710, entitled "Precision Trim Circuit for Delay Lines", which is referenced above.

An input terminal of multi-tap delay circuit 510 is coupled to input terminal IN of tuneable delay line 500. Multi-tap delay circuit 510 has 128 sequentially ordered delayed output terminals which drive 128 delayed output signals D_O[0–127] to the 128 sequentially ordered input terminals of Gray code multiplexer 520. In addition to 128 input terminals, Gray code multiplexer 520 has 7 Gray code control terminals, which are coupled to Gray code control terminals GC[0–6] of tuneable delay line 500, and an output terminal coupled to output terminal OUT of tuneable delay line 500. Other embodiments of tuneable delay line 500 may use a Gray code multiplexer with differing numbers of input terminals and select terminals.

Multiplexer 520 drives one of delayed output signals D_O[0–127] from multi-tap delay circuit 510 to output terminal OUT of tuneable delay line 500 under control of Gray code control signals GC[0–6]. The input terminals of Gray code multiplexer 520 are mapped to the values of Gray code control signals GC[0–6] so that Gray code control signals GC[0–6] can select the desired delayed output signal without causing glitches due to race conditions on Gray code control signals GC[0–6]. Gray code multiplexer 520 is described more fully below.

Figure 6:
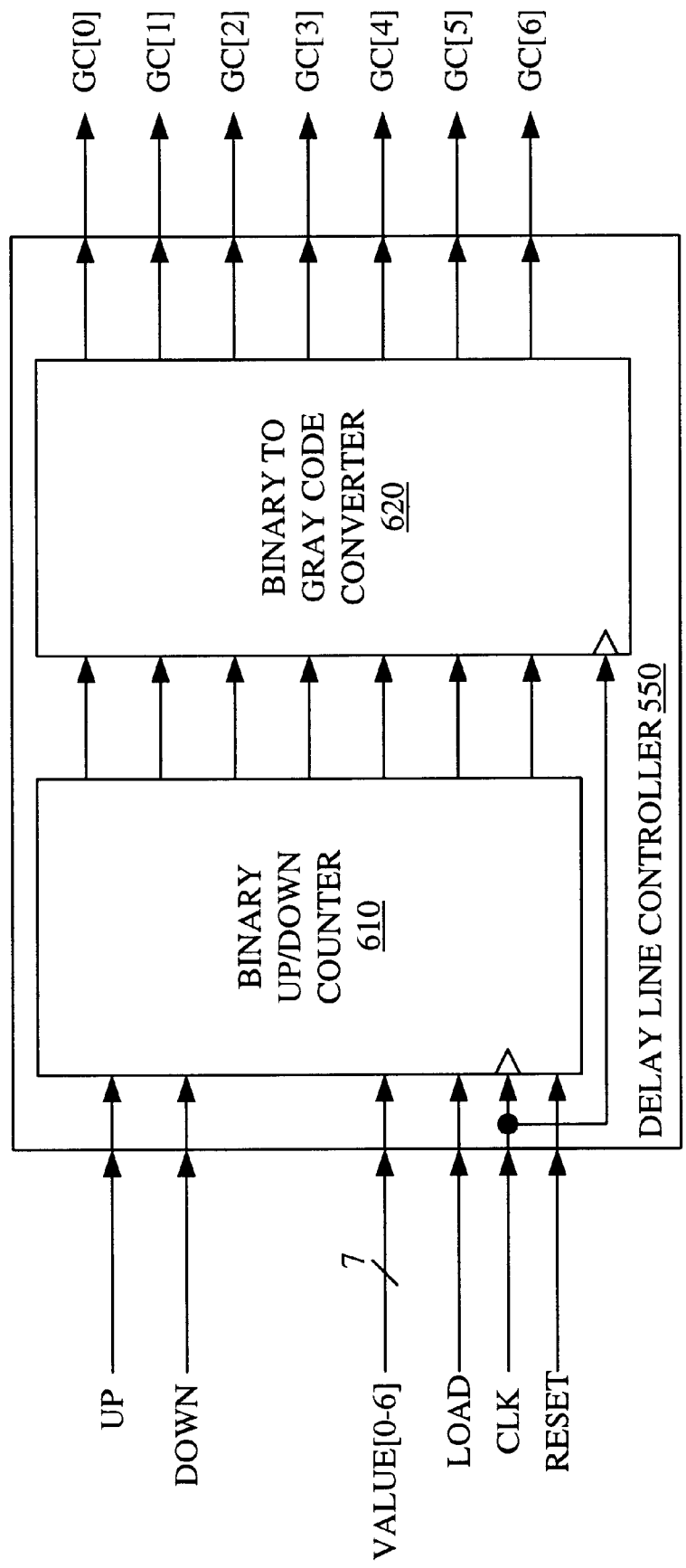
FIG. 6 is a block diagram of a delay line controller in accordance with one embodiment of the invention.

FIG. 6 shows one embodiment of delay line controller 550. The embodiment of FIG. 6 comprises a seven-bit binary up/down counter 610 coupled to a seven-bit binary to Gray code converter 620. For embodiments of tuneable delay line 500 using different numbers of delay elements, binary up/down counter 610 and binary to Gray code converter 620 can use different numbers of bits. Binary up/down counter 610 is configured to count sequentially to minimize the risk of glitches in tuneable delay line 500.

Binary up/down counter 610 comprises an up control terminal, a down control terminal, seven input terminals, a load control terminal, a clock input terminal, a reset terminal, and seven output terminals. A clock signal CLK is coupled to the clock input terminal for synchronous versions of binary up/down counter 610. For asynchronous versions of binary up/down counter 610, the clock terminal is not necessary. The up control terminal is configured to receive a count up control signal UP, which causes the value in binary up/down counter 610 to increase by one for every active edge of clock signal CLK in which count up control signal UP is in an active state (typically logic high). Conversely, the down control terminal is configured to receive a count down control signal DOWN, which causes the value in binary up/down counter 610 to decrease by one for every active edge of clock signal CLK in which count down control signal DOWN is in an active state. (In another embodiment, up and down control terminals are replaced by a single up/down control terminal.) A load signal LOAD applied to the load terminal of binary up/down counter 610 causes binary up/down counter 610 to load the seven-bit value VALUE[0–6] applied to the input terminals of binary up/down counter 610. A reset signal RESET applied to the reset terminal of binary up/down counter 610 is used to reset binary up/down counter 610.

Binary up/down counter 610 drives a seven-bit binary number to binary to Gray code converter 620. Binary to Gray code converter 620 converts the seven-bit binary number from binary up/down counter 610 into a seven-bit Gray code number to form Gray code control signals GC[0–6]. As used herein, GC[6] is the most significant bit and GC[0] is the least significant bit of the Gray code number represented by Gray code control signals GC[0–6]. Binary Gray code converter 620 may use synchronous logic and thus may also be coupled to receive clock signal CLK.

As is well known in the art, a Gray code is a binary numbering system in which the binary representations of two sequential numbers differ by exactly one bit. For example, TABLE 1 shows the binary representation and a Gray code representation for the decimal numbers zero to seven.

TABLE 1

| DECIMAL | BINARY | GRAY CODE |
| --- | --- | --- |
| 0 | 000 | 000 |
| 1 | 001 | 001 |
| 2 | 010 | 011 |
| 3 | 011 | 010 |

TABLE 1-continued

| DECIMAL | BINARY | GRAY CODE |
| --- | --- | --- |
| 4 | 100 | 110 |
| 5 | 101 | 111 |
| 6 | 110 | 101 |
| 7 | 111 | 100 |

As shown in TABLE 1, the transition from decimal 3 to decimal 4 involves switching all three bits of the binary representation, i.e. 011 to 100. In a circuit implementation, it is very unlikely that all three bits can switch simultaneously. Thus, it is possible that the transition between the binary numbers may momentarily result in an inaccurate value, which in turn can cause glitches. For example, in switching from 011 to 100 the bits may transition as follows: 011 to 111 to 101 to 100, if the most significant bit transitions faster than the intermediate significant bit and the intermediate significant bit transitions faster than the least significant bit. However, for the Gray code representation only one bit (i.e., the most significant bit) must switch during the transition from decimal 3 to decimal 4, i.e. 010 to 110. Thus, with the Gray code representation the Gray code bits do not transition to inaccurate values during transitions between sequential decimal numbers. Accordingly, glitches caused by transitory inaccuracies of binary numbers are eliminated.

Returning to FIG. 5, each delayed output signal D_O[X] is coupled to an input terminal of Gray code multiplexer 520. The specific input terminal coupled to receive delayed output signal D_O[X] is selected by Gray code control signals GC[0–6] having a value equivalent to the Gray code representation of X. For example, delayed output signals D_O[3], D_O[4], D_O[126], and D_O[127] are selected with GC[0–6] equal to 0000010, 0000110, 1000001, and 1000000, respectively. One version of a Gray code representation of the decimal numbers zero to 127 is presented in Appendix A. Accordingly, the delay provided by tuneable delay line 500 can be increased by driving count up control signal UP (FIG. 6) to the active state and decreased by driving count down control signal DOWN to the active state. Because delay line controller 550 counts sequentially up or down using a Gray code sequence for Gray code control signals GC[0–6], tuneable delay line 500 is not subject to glitches caused by race conditions in the select lines. Some embodiments of tuneable delay line 500 incorporate delay line controller 550. For example, if the embodiment of FIG. 6 is incorporated within tuneable delay line 500, tuneable delay line 500 can be controlled directly by count down control signal DOWN, count up control signal UP, reset signal RESET, load signal LOAD, and load value VALUE[0–6].

Figure 7:
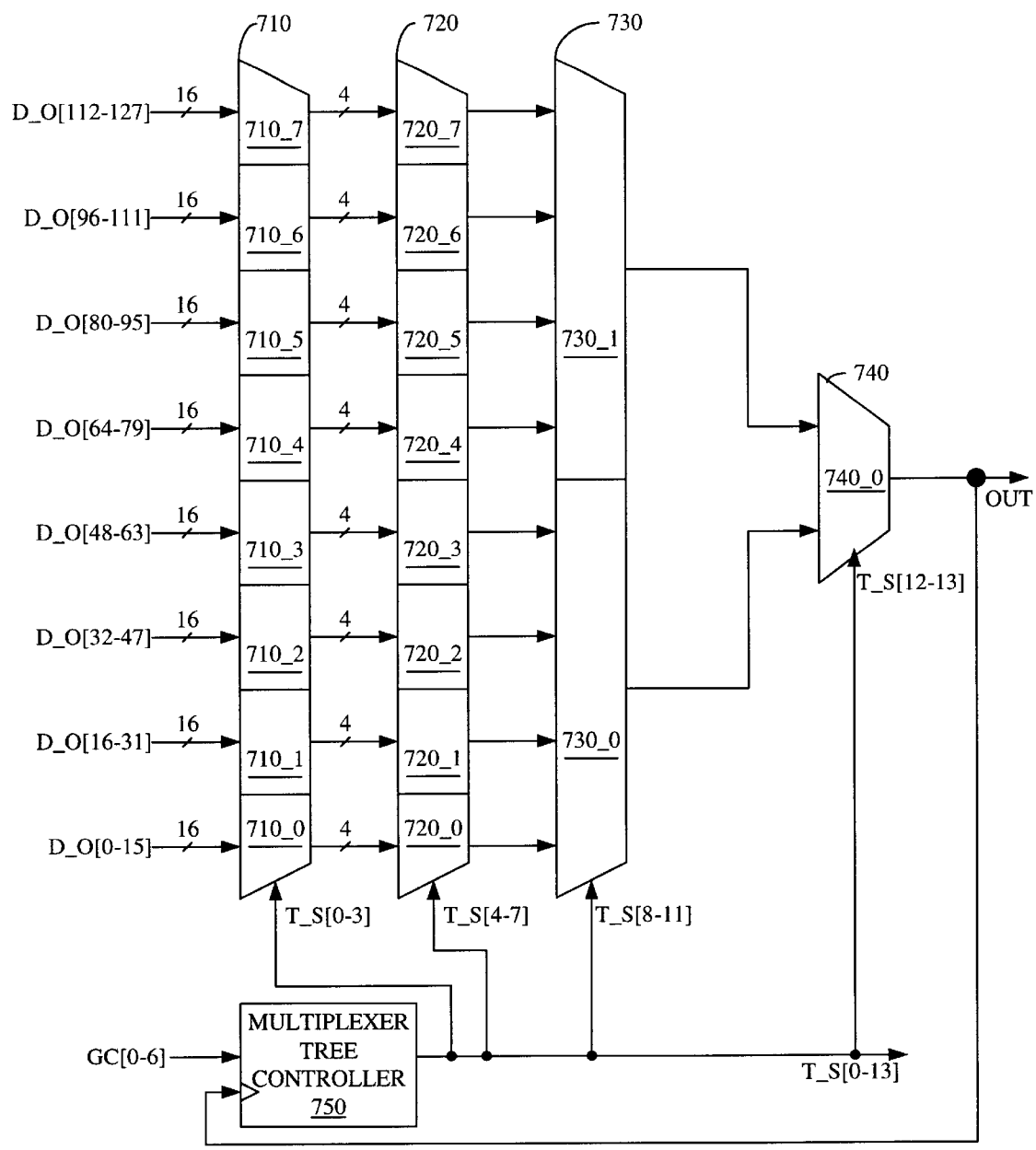
FIG. 7 is a block diagram of a multiplexer tree in accordance with one embodiment of the invention.

FIG. 7 provides a block diagram of one embodiment of Gray code multiplexer 520 of FIG. 5. The embodiment of FIG. 7 is a four level Gray code multiplexer tree comprising a first Gray code multiplexer level 710, a second Gray code multiplexer level 720, a third Gray code multiplexer level 730, a fourth (last) Gray code multiplexer level 740, and a multiplexer tree controller 750. Multiplexer tree controller 750 is coupled to receive Gray code control signals GC[0–6] and to generate tree select control lines T_S[0–13], as described in conjunction with FIG. 9. Tree select control lines T_S[0–13] control the multiplexer levels to select the appropriate delayed output signal, as explained in greater detail below.

First multiplexer level 710 comprises eight multiplexer modules 710_0 to 710_7. Multiplexer modules 710_0 to 710_7 act as 16-to-4 multiplexers that select four of the 16 input signals to drive as output signals. Thus, multiplexer modules 710_0 to 710_7 are each coupled to receive a 16-member subset of the delayed output signals and drive four output signals. Specifically, multiplexer modules 710_0, 710_1, 710_2, 710_3, 710_4, 710_5, 710_6, and 710_7 receive delayed output signals D_O[0–15], D_O[16–31], D_O[32–47]D_O[48–63], D_O[64–79], D_O[80–95], D_O[96–111], and D_O[112–127], respectively. The four output signals of each multiplexer module 710_X are coupled to a multiplexer module 720_X of second Gray code multiplexer level 720, where X is an integer between 0 and 7, inclusive. Multiplexer modules 710_0 to 710_7 are controlled in parallel by tree select control lines T_S[0–3], as described in greater detail below in conjunction with FIG. 8.

Second multiplexer level 720 comprises eight multiplexer modules 720_0 to 720_7. Multiplexer modules 720_0 to 720_7 act as 4-to-1 multiplexers that select one of four input signals to drive as an output signal. Thus, multiplexer modules 720_0 to 720_7 are each coupled to receive four signals from first multiplexer level 710 and to drive one output signal. The output signals of multiplexer modules 720_0 to 720_3 drive multiplexer module 730_0 of third multiplexer level 730. The output signals of multiplexer modules 720_4 to 720_7 drive multiplexer module 730_1 of third multiplexer level 730. Multiplexer modules 720_0 to 720_7 are controlled in parallel by tree select control lines T_S[4–7], as described in greater detail below in conjunction with FIG. 8.

Third multiplexer level 730 comprises two multiplexer modules 730_0 and 730_1. Multiplexer modules 730_0 and 730_1 act as 4-to-1 multiplexers, which select one of four input signals to drive as an output signal. Thus, multiplexer modules 730_0 and 730_1 are each coupled to receive four signals from second multiplexer level 720 and to drive one output signal. The output signals of multiplexer modules 730_0 and 730_1 drive fourth multiplexer level 740. Multiplexer modules 730_0 and 730_1 are controlled in parallel by tree select control lines T_S[8–11], as described in greater detail below in conjunction with FIG. 8.

Figure 8:
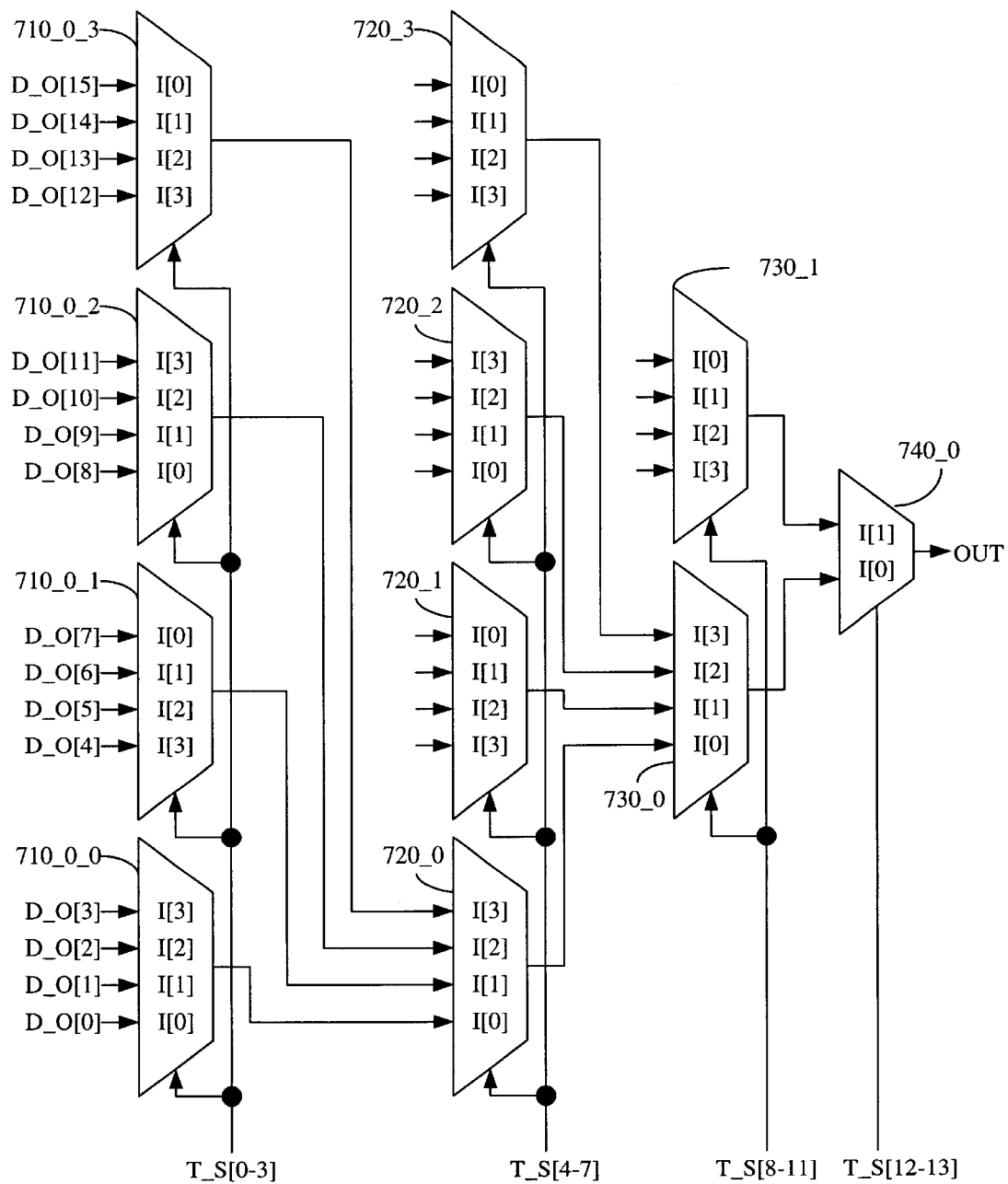
FIG. 8 is a schematic diagram of a multiplexer tree in accordance with one embodiment of the present invention.

Fourth multiplexer level 740 can be formed using a single 2-input multiplexer 740_0. Multiplexer 740_0 receives the output signals provided by multiplexer modules 730_0 and 730_1 and drives one of the input signals as the output signal OUT of Gray code multiplexer 520. Multiplexer 740_0 is controlled by tree select control lines T_S[12–13], as described in greater detail below in conjunction with. FIG. 8.

FIG. 8 is a schematic diagram that illustrates multiplexer modules 710_0, 720_0, 720_1, 720_2, 720_3, 730_0, 730_1, and 740 of FIG. 7 in more detail. Multiplexer modules 710_0, 720_0, 720_1, 720_2, 720_3, 730_0, and 730_1 are implemented using 4-input multiplexers. Multiplexer module 740 is implemented using a 2-input multiplexer. (Each 4-input Gray code multiplexer receives four select lines from multiplexer tree controller 750 (FIG. 7), which is shown in greater detail in FIG. 9.) In FIG. 8, each input terminal of a 4-input Gray code multiplexer is labeled I[X], where X is an integer between 0–3, inclusive. Each input terminal of a 4-input multiplexer corresponds to one of the select lines coupled to the multiplexer and is selected by driving the corresponding select line to an active state (typically logic high). Multiplexer controller 750 drives one of the select lines on each multiplexer to an active state to select the corresponding input terminal. The specific correspondence between select lines and input terminals is explained below.

The circuit implementation of multiplexer modules 710_0 to 710_7 can be identical. Therefore, only multiplexer module 710_0 is shown in detail in FIG. 8. Multiplexer module 710_0 comprises 4-input multiplexers 710_0_0 to 710_0_3. Multiplexer 710_0_0 receives delayed output signals D_O[0–3] and drives an output signal to input terminal I[0] of multiplexer 720_0. Multiplexer 710_0_1 receives delayed output signals D_O[7–4] and drives an output signal to input terminal I[1] of multiplexer 720_0. Multiplexer 710_0_2 receives delayed output signals D_O[11-8] and drives an output signal to input terminal I[2] of multiplexer 720_0. Multiplexer 710_0_3 receives delayed output signals D_O[15–12] and drives an output signal to input terminal I[3] of multiplexer 720_0.

Multiplexers 710_0_0 to 710_0_3 are operated in parallel by multiplexer controller 750 since the select lines of multiplexers 710_0_0 to 710_0_3 are coupled in parallel to receive tree select control signals T_S[0–3]. Input terminal I[0] is selected in all multiplexers within first multiplexer level 710, if tree select control line T_S[0] is in the active state. Similarly, input terminal I[1], I[2], or I[3] is selected if select control line T_S[1], T_S[2], or T_S[3] is in the active state, respectively. Thus, if select line T_S[1] is in the active state, multiplexer 710_0_0 provides delayed output signal D_O[1], multiplexer 710_0_1 provides delayed output signal D_O[6], multiplexer 710_0_2 provides delayed output signal D_O[9], and multiplexer 710_0_3 provides delayed output signal D_O[14].

One way to implement the Gray code selection scheme, as illustrated in FIG. 8, is to reverse the order of the input terminals in every other multiplexer within each multiplexer level. For example, in multiplexer 710_0_1, input terminal I[3] is coupled to delayed output signal D_O[X], where X is the lowest number among the four delayed output signals which are coupled to multiplexer 710_0_1 (i.e., delayed output signal D_O[4]). However, in multiplexer 710_0_0, input terminal I[3] is coupled to delayed output signal D_O[Y], where the number Y is the largest number among the four delayed output signals coupled to multiplexer 710_0_1 (i.e., delayed output signal D_O[3]). Thus, the input terminals of each multiplexer are sequentially ordered. The sequential ordering of the input terminals of multiplexer 710_0_1 is reversed compared to the ordering of the delayed output signals. However the sequential ordering of the input terminals of multiplexer 710_0_0 is the same as the ordering of the delayed output signals. The same reversed coupling is exhibited between any two adjacent multiplexers within each multiplexer level.

In the described example, multiplexer modules 720_0 to 720_7 are identical and are operated in parallel by multiplexer tree controller 750. Therefore, only multiplexer module 720_0 is described in detail. In one embodiment, multiplexer module 720_0 is a 4-input multiplexer that receives four signals from multiplexers 710_0_0 to 710_0_3 and drives an output signal to input terminal I[0] of multiplexer 730_0. The select lines of 4-input multiplexer 720_0 (as well as the select lines of other multiplexers in multiplexer level 720) are coupled to receive tree select control signals T_S[4–7]. Input terminal I[0] of all multiplexers within second multiplexer level 720 is selected if tree select control line T_S[4] is in the active state. Similarly, input terminal I[1], I[2], or I[3] is selected if tree select control line T_S[5], T_S[6], or T_S[7] is in the active state, respectively. Again, the input terminals are coupled in reverse order for adjacent multiplexers in second multiplexer level 720.

In the described example, multiplexer modules 730_0 and 730_1 are identical and are operated in parallel by multiplexer controller 750. Therefore, only multiplexer module 730_0 is described in detail. In this embodiment, multiplexer module 730_0 is a 4-input multiplexer that receives four signals from multiplexers 720_0 to 720_3 and drives an output signal to input terminal I[0] of multiplexer 740_0. The select terminals of multiplexers 730_0 and 730_1 are coupled to receive tree select control signals T_S[8–11]. Input terminals I[0] of all multiplexers within third multiplexer level 730 are selected if select control line T_S[8] is in the active state. Similarly, input terminal I[1], I[2], or I[3] is selected if tree select control line T_S[9], T_S[10], or T_S[11] is in the active state, respectively. Again, the input terminals are coupled in reverse order for adjacent multiplexers in third multiplexer level 730.

In the embodiment of FIG. 8, fourth multiplexer level 740 comprises a 2-input multiplexer 740_0. Multiplexer 740_0 receives one signal from multiplexer 730_0 and one signal from 730_1 and drives an output signal to output terminal OUT of Gray code multiplexer 520. The select terminals of multiplexer 740_0 are coupled to receive tree select control signals T_S[12–13]. Input terminal I[0] of multiplexer 740_0 is selected if select control line T_S[12] is in the active state. Similarly, input terminal I[1] is selected if select control lines T_S[13] is in the active state.

Figure 9:
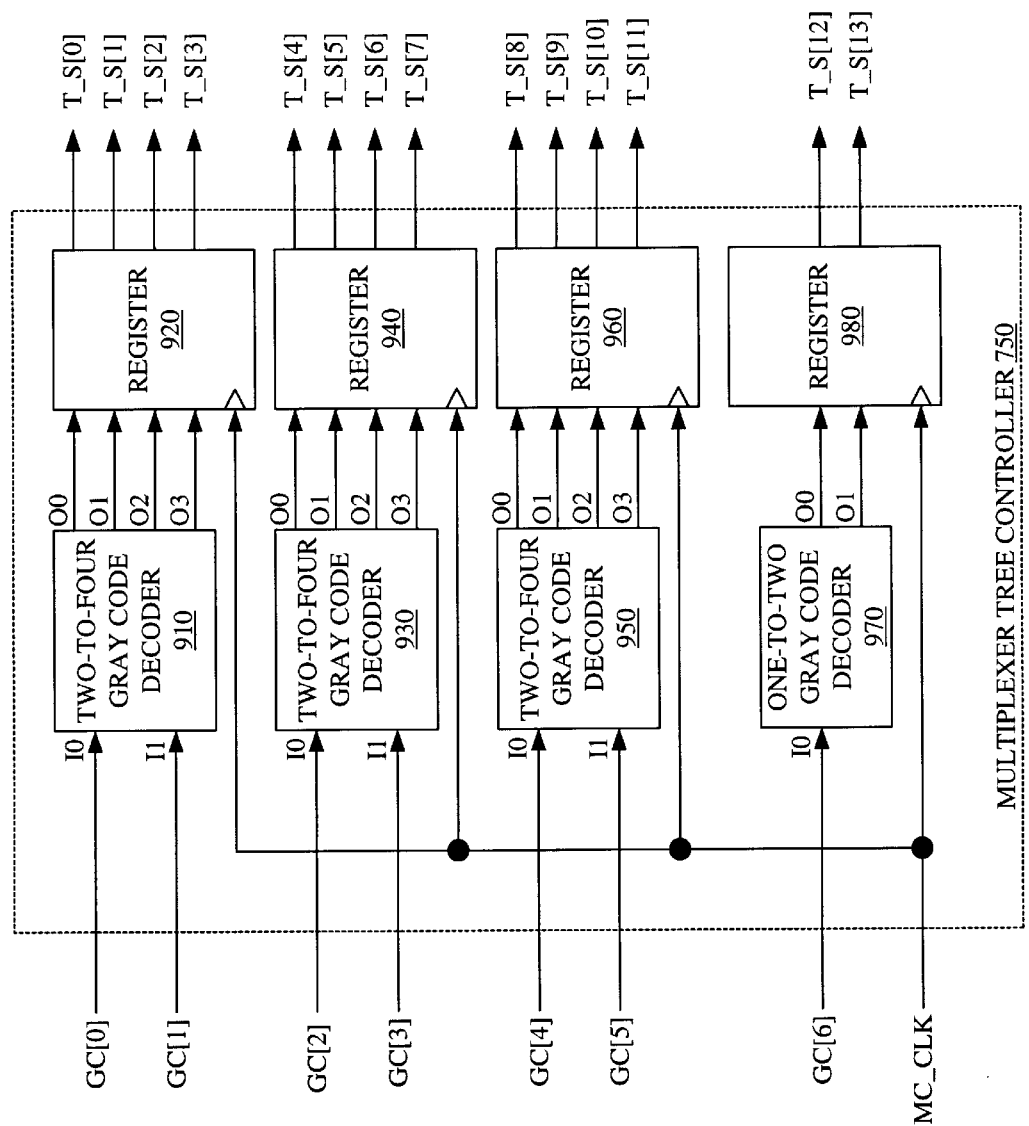
FIG. 9 is a block diagram of a multiplexer tree controller in accordance with one embodiment of the present invention.

FIG. 9 is a block diagram of multiplexer controller 750, which comprises a 1-to-2 Gray code decoder 970, 2-to-4 Gray code decoders 910, 930, and 950, and four optional registers 920, 940, 960, and 980. Each of the 2-to-4 Gray code decoders decodes two input signals on input terminals I0 and I1 into four output signals on output terminals O1, O2, O3, and O4. TABLE 2 shows the truth table for an active high embodiment of the 2-to-4 Gray code decoders. For an active low embodiment, the output signals are logically inverted.

TABLE 2

| I1 | I0 | O3 | O2 | O1 | O0 |
|----|----|----|----|----|----|
| 0  | 0  | 0  | 0  | 0  | 1  |
| 0  | 1  | 0  | 0  | 1  | 0  |
| 1  | 1  | 0  | 1  | 0  | 0  |
| 1  | 0  | 1  | 0  | 0  | 0  |

1-to-2 Gray code decoder 970 decodes a single input signal on input terminal I0 into two output signals on output terminals O0 and O1. For a single bit, Gray code and binary are equivalent, thus a standard 1-to-2 decoder can be used. TABLE 3 provides the truth table for an active high embodiment of 1-to-2 Gray code decoder 970.

TABLE 3

| I0 | O1 | O0 |
|----|----|----|
| 0  | 0  | 1  |
| 1  | 1  | 0  |

For tuneable delay line 500 (FIG. 5), 2-to-4 Gray code decoder 910 decodes Gray code control signals GC[0] and GC[1] into four output signals that are registered by register 920 to drive tree select control lines T_S[0], T_S[1], T_S[2], and T_S[3]. Specifically, Gray code control signals GC[0] and GC[1] are driven to input terminals I0 and I1 of 2-to-4 Gray code decoder 910, respectively. Output terminals O0, O1, O2, and O3 of 2-to-4 Gray code decoder 910 drive signals that are registered by register 920 to drive tree select control signals T_S[0], T_S[1], T_S[2], and T_S[3], respectively.

Similarly, 2-to-4 Gray code decoder 930 decodes Gray code control signals GC[2] and GC[3] into four output signals that are registered by register 940 to drive tree select control lines T_S[4], T_S[5], T_S[6], and T_S[7]. 2-to-4 Gray code decoder 950 decodes Gray code control signals GC[4] and GC[5] into four output signals that are registered by register 960 to drive tree select control lines T_S[8], T_S[9],T_S[10], and T_S[11].

1-to-2 Gray code decoder 970 decodes Gray code control signal GC[6] into two output signals that are registered by register 980 to drive tree select control lines T_S[12], and T_S[13]. Specifically, Gray code control signal GC[6] is driven to input terminal I0 of 1-to-2 Gray code decoder 970. Output terminals O0 and O1 of 1-to-2 Gray code decoder 970 drive signals that are registered by register 980 to drive tree select control signals T_S[12], and T_S[13], respectively.

Registers 920, 940, 960, and 980 are clocked by a multiplexer controller clock signal MC_CLK. As shown in FIG. 7, in one embodiment multiplexer controller clock signal MC_CLK is received from the output terminal of multiplexer 740_0. Other embodiments may use clock buffers (not shown) to generate multiplexer controller clock signal MC_CLK. Using a clock signal based on the output of multiplexer 740_0 can further minimize the occurrence of glitches by insuring that switching of the selected delayed output signal occurs after a clock edge rather than during a clock edge.

To better illustrate the operation of delay line 500 (FIG. 5),assume delay line 500 is currently providing delayed output signal D_O[3], but needs to be adjusted to output delayed output signal D_O[4]. To provide delayed output signal D_O[3], binary up/down counter 610 (FIG. 6) contains a binary value 0000011, which is equivalent to decimal value 3. Binary to Gray code converter 620 generates GC[6–0] equal to 0000010 from binary value 0000011 (see Appendix A). Multiplexer tree controller 750 (FIG. 7) generates T_S[13–0] equal to 01000100011000 (see Tables 2 and 3 and FIG. 9). Because T_S[12] is in the active state (e.g., the logic high state) multiplexer 740_0 (FIG. 8) selects input terminal I[0], which is coupled to the output terminal of multiplexer 730_0. Because T_S[8] is in the active state, multiplexer 730_0 selects input terminal I[0], which is coupled to the output terminal of multiplexer 720_0. Because T_S[4] is in the active state, multiplexer 720_0 selects input terminal I[0], which is coupled to the output terminal of multiplexer 710_0_0. Because T_S[3] is in the active state, multiplexer 710_0_0 selects input terminal I[3], which is coupled to receive delayed output signal D_O[3]. Thus, delay line 500 provides delayed output signal D_O[3].

To adjust delay line 500 to output delayed output signal D_O[4], up count control signal UP (FIG. 6) is driven to an active state (e.g., a logic high state) so that binary up/down counter 610 counts to binary value 0000100. Binary to Gray code converter 620 generates GC[6–0] equal to 0000110 from binary value 0000100 (see Appendix A). Multiplexer tree controller 750 (FIG. 7) generates T_S[13–0] equal to 01000100101000 (see Tables 2 and 3 and FIG. 9). Because T_S[12] is in the active state (logic high state) multiplexer 740_0 (FIG. 8) selects input terminal I[0],.which is coupled to receive the output signal of multiplexer 730_0. Because TS[8] is in the active state, multiplexer 730_0 selects input terminal I[0], which is coupled to the output terminal of multiplexer 720_0. Because T_S[51] is in the active state, multiplexer 720_0 selects input terminal I(1-], which is coupled to the output terminal of multiplexer 710_0_1.

Because T_S[3] is in the active state, multiplexer 710_0_1 selects input terminal I[3], which is coupled to receive delayed output signal D_O[4]. Thus, delay line 500 provides delayed output signal D_O[4]. Since the change was accomplished by changing only one of the multiplexer control signals, no glitches occurred during the transitions.

Figure 10:
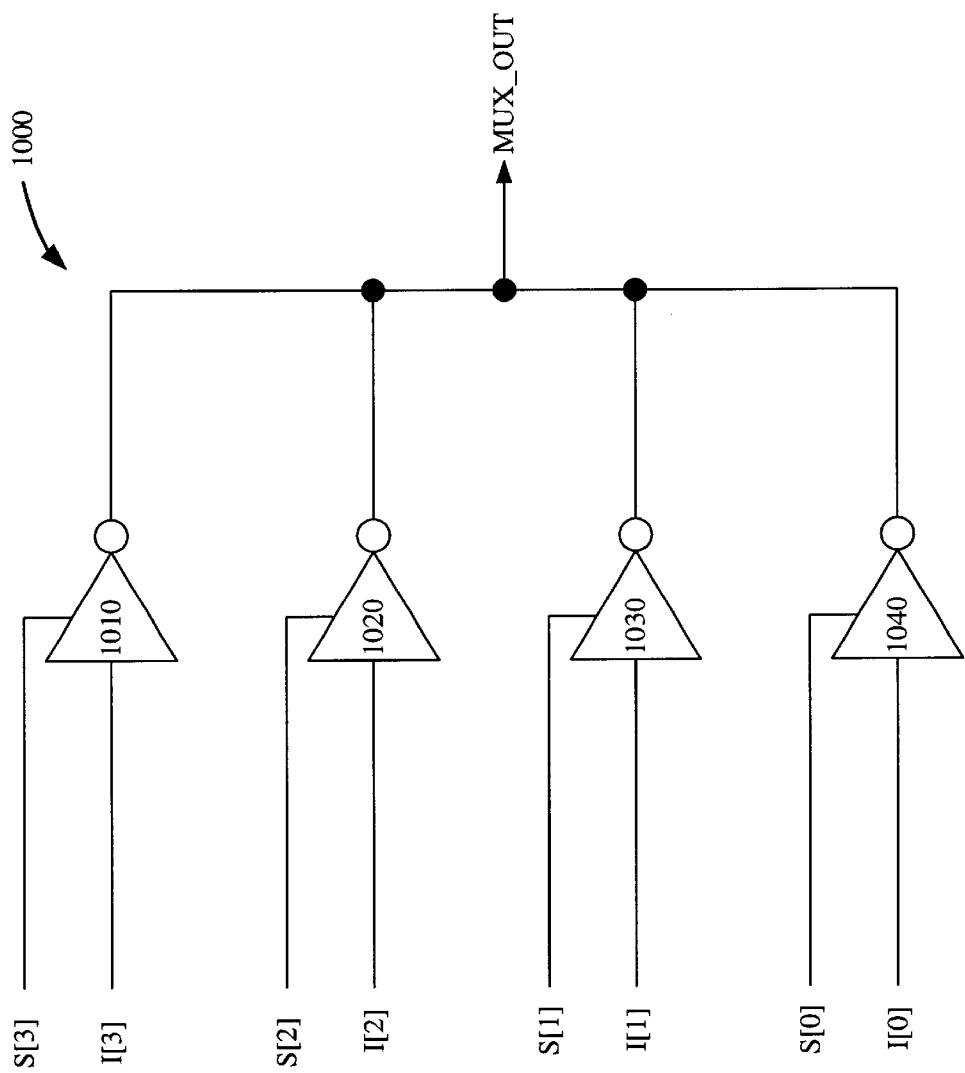
FIG. 10 is a schematic diagram of a 4-input multiplexer in accordance with one embodiment of the present invention.

FIG. 10 shows an embodiment of a 4-input multiplexer 1000 in accordance with one embodiment of the present invention. Multiplexer 1000 can replace, for example, the above-described 4-input multiplexers. Multiplexer 1000 comprises three-state inverters 1010, 1020, 1030 and 1040. Multiplexer 1000 is an inverting multiplexer. Three-state inverter 1010 receives an input signal I[3] and is controlled by a select signal S[3]. If select signal S[3] is in the active state (e.g., logic high), three-state inverter 1010 drives an inverted version of input signal I[3] as output signal MUX_OUT. If select signal S[3] is in the inactive state (e.g., logic low), three-state inverter 1010 is forced into a high impedance state and does not drive output signal MUX_OUT. Similarly, three-state inverters 1020, 1030, and 1040, which receive input signals I[2], I[1], and I[0], respectively, are controlled by select signals S[2], S[1], and S[0], respectively. Only one of the select signals S[0–3] is active at a given time. Other embodiments of 4-input multiplexers may also be used. For example, a 4-input multiplexer can be formed using transmission gates.

Figure 11:
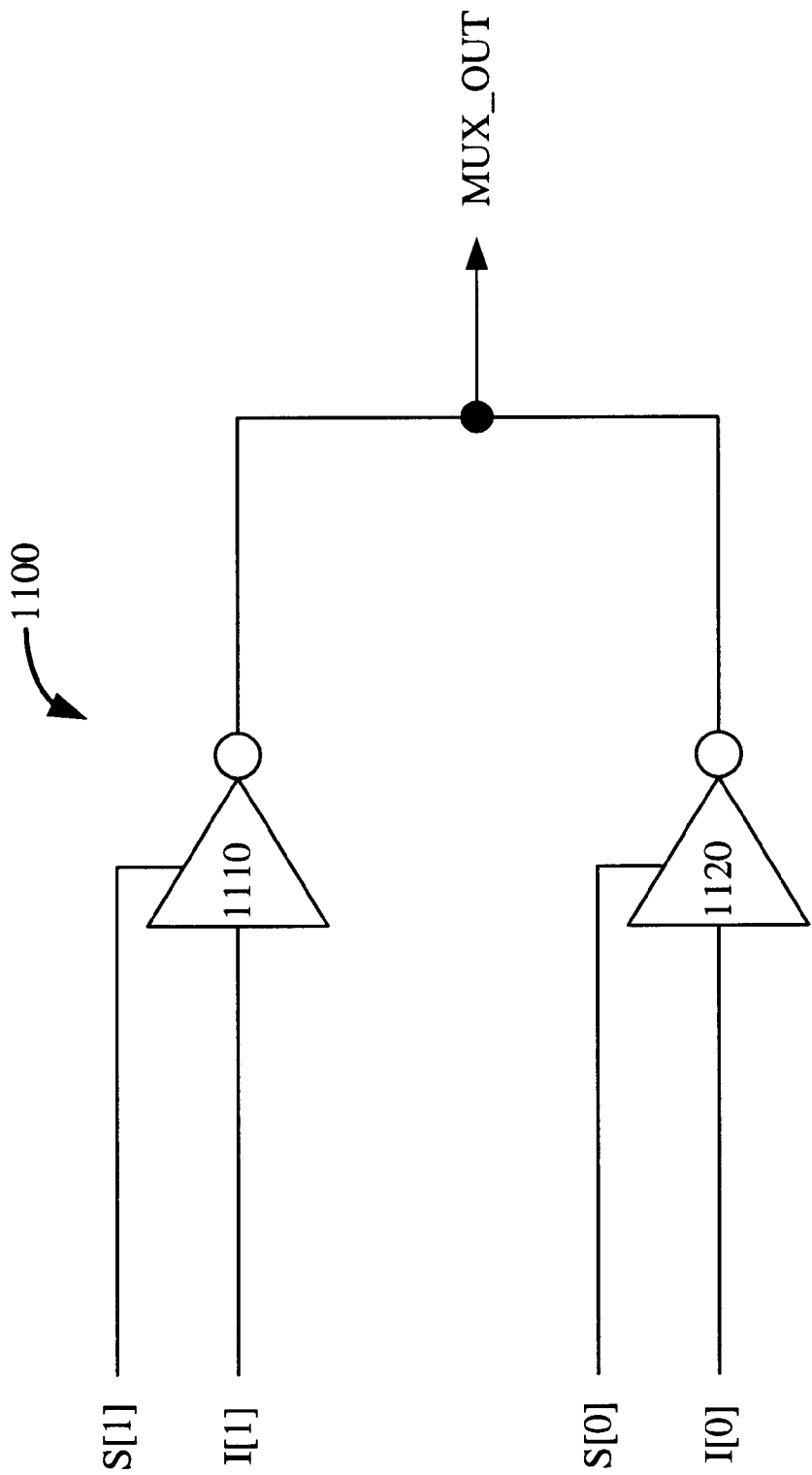
FIG. 11 is a schematic diagram of a 2-input multiplexer in accordance with one embodiment of the present invention.

FIG. 11 shows an embodiment of a 2-input multiplexer 1100 in accordance with one embodiment of the present invention. Multiplexer 1100 can replace, for example, multiplexer 740_0 described above. Multiplexer 1100 comprises three-state inverters 1110 and 1120. Multiplexer 1100 is an inverting multiplexer. Three-state inverter 1110 receives an input signal I[1] and is controlled by a select signal S[1]. If select signal S[1] is in the active state (e.g., logic high), three-state inverter 1110 drives an inverted version of input signal I[1] as output signal MUX_OUT. If select signal S[1] is in the inactive state (e.g., logic low), three-state inverter 1110 is forced into a high impedance state and does not drive output signal MUX_OUT. Similarly, three-state inverter 1120, which receives input signal I[0], is controlled by select signal S[0]. Other embodiments of 2-input multiplexers may also be used. For example, a 2-input multiplexer can be formed using transmission gates.

Thus, a glitchless delay line using a 128 delay element multi-tap delay circuit and a 128 input Gray code multiplexer is described. Those skilled in the art can apply the principles of the present invention described herein to create glitchless delay lines for other purposes as well as clock synchronization. For example, delay lines are used extensively in asynchronous systems to control signal timing. Delay lines are also used to adjust relative delays of different signal paths in both synchronous and asynchronous circuits. In addition, those skilled in the art can adapt the principles described herein to delay lines using any number of delay elements. For example, one skilled in the art can create a 256 delay element delay line by replacing 2-input multiplexer 740_0 (FIG. 8) with a 4-input multiplexer, replacing 1-to-2 Gray code decoder 970 (FIG. 9) with a 2-to-4 Gray code decoder, and including another copy of the circuits forming multiplexer levels 710, 720, and 730 (FIG. 7).

Similarly, one skilled in the art can create a smaller glitchless delay line by using only a subset of Gray code multiplexer 520. For example, an 8-input Gray code multiplexer is formed by using only 4-input multiplexer 730_1 (FIG. 8), 4-input multiplexer 730_0, and 2-input multiplexer 740_0. Similarly, a 16-input Gray code multiplexer can be formed using 4-input multiplexers 710_0_0, 710_0_1, 710_0_2, 710_0_3, and 720_0.

In the various embodiments of this invention, novel structures have been described for glitchless delay line circuits for use in digital systems and integrated circuits. By forming a delay line with a novel Gray code multiplexer with a multi-tap delay circuit, the present invention prevents glitches from occurring while the delay line is adjusted. The various embodiments of the structures and methods of this invention that are described herein are illustrative only of the principles of this invention and are not intended to limit the scope of the invention to the particular embodiments described. For example, in view of this disclosure, those skilled in the art can define other Gray code multiplexers, delay elements, multi-tap delay circuits, controllers, multiplexer trees, counters, and so forth, and use these alternative features to create a method, circuit, or system according to the principles of this invention. Thus, the invention is limited only by the following claims.

APPENDIX A
GRAY CODE VALUES

| DECIMAL | BINARY (7 bits) | GRAY CODE (7 bits) |
|---|---|---|
| 0 | 0 00 00 00 | 0 00 00 00 |
| 1 | 0 00 00 01 | 0 00 00 01 |
| 2 | 0 00 00 10 | 0 00 00 11 |
| 3 | 0 00 00 11 | 0 00 00 10 |
| 4 | 0 00 01 00 | 0 00 01 10 |
| 5 | 0 00 01 01 | 0 00 01 11 |
| 6 | 0 00 01 10 | 0 00 01 01 |
| 7 | 0 00 01 11 | 0 00 01 00 |
| 8 | 0 00 10 00 | 0 00 11 00 |
| 9 | 0 00 10 01 | 0 00 11 01 |
| 10 | 0 00 10 10 | 0 00 11 11 |
| 11 | 0 00 10 11 | 0 00 11 10 |
| 12 | 0 00 11 00 | 0 00 10 10 |
| 13 | 0 00 11 01 | 0 00 10 11 |
| 14 | 0 00 11 10 | 0 00 10 01 |
| 15 | 0 00 11 11 | 0 00 10 00 |
| 16 | 0 01 00 00 | 0 01 10 00 |
| 17 | 0 01 00 01 | 0 01 10 01 |
| 18 | 0 01 00 10 | 0 01 10 11 |
| 19 | 0 01 00 11 | 0 01 10 10 |
| 20 | 0 01 01 00 | 0 01 11 10 |
| 21 | 0 01 01 01 | 0 01 11 11 |
| 22 | 0 01 01 10 | 0 01 11 01 |
| 23 | 0 01 01 11 | 0 01 11 00 |
| 24 | 0 01 10 00 | 0 01 01 00 |
| 25 | 0 01 10 01 | 0 01 01 01 |
| 26 | 0 01 10 10 | 0 01 01 11 |
| 27 | 0 01 10 11 | 0 01 01 10 |
| 28 | 0 01 11 00 | 0 01 00 10 |
| 29 | 0 01 11 01 | 0 01 00 11 |
| 30 | 0 01 11 10 | 0 01 00 01 |
| 31 | 0 01 11 11 | 0 01 00 00 |
| 32 | 0 10 00 00 | 0 11 00 00 |
| 33 | 0 10 00 01 | 0 11 00 01 |
| 34 | 0 10 00 10 | 0 11 00 11 |
| 35 | 0 10 00 11 | 0 11 00 10 |
| 36 | 0 10 01 00 | 0 11 01 10 |
| 37 | 0 10 01 01 | 0 11 01 11 |
| 38 | 0 10 01 10 | 0 11 01 01 |
| 39 | 0 10 01 11 | 0 11 01 00 |
| 40 | 0 10 10 00 | 0 11 11 00 |
| 41 | 0 10 10 01 | 0 11 11 01 |
| 42 | 0 10 10 10 | 0 11 11 11 |
| 43 | 0 10 10 11 | 0 11 11 10 |
| 44 | 0 10 11 00 | 0 11 10 10 |
| 45 | 0 10 11 01 | 0 11 10 11 |
| 46 | 0 10 11 10 | 0 11 10 01 |
| 47 | 0 10 11 11 | 0 11 10 00 |
| 48 | 0 11 00 00 | 0 10 10 00 |

-continued

APPENDIX A
GRAY CODE VALUES

| DECIMAL | BINARY (7 bits) | GRAY CODE (7 bits) |
|---|---|---|
| 49 | 0 11 00 01 | 0 10 10 01 |
| 50 | 0 11 00 10 | 0 10 10 11 |
| 51 | 0 11 00 11 | 0 10 10 10 |
| 52 | 0 11 01 00 | 0 10 11 10 |
| 53 | 0 11 01 01 | 0 10 11 11 |
| 54 | 0 11 01 10 | 0 10 11 01 |
| 55 | 0 11 01 11 | 0 10 11 00 |
| 56 | 0 11 10 00 | 0 10 01 00 |
| 57 | 0 11 10 01 | 0 10 01 01 |
| 58 | 0 11 10 10 | 0 10 01 11 |
| 59 | 0 11 10 11 | 0 10 01 10 |
| 60 | 0 11 11 00 | 0 10 00 10 |
| 61 | 0 11 11 01 | 0 10 00 11 |
| 62 | 0 11 11 10 | 0 10 00 01 |
| 63 | 0 11 11 11 | 0 10 00 00 |
| 64 | 1 00 00 00 | 1 10 00 00 |
| 65 | 1 00 00 01 | 1 10 00 01 |
| 66 | 1 00 00 10 | 1 10 00 11 |
| 67 | 1 00 00 11 | 1 10 00 10 |
| 68 | 1 00 01 00 | 1 10 01 10 |
| 69 | 1 00 01 01 | 1 10 01 11 |
| 70 | 1 00 01 10 | 1 10 01 01 |
| 71 | 1 00 01 11 | 1 10 01 00 |
| 72 | 1 00 10 00 | 1 10 11 00 |
| 73 | 1 00 10 01 | 1 10 11 01 |
| 74 | 1 00 10 10 | 1 10 11 11 |
| 75 | 1 00 10 11 | 1 10 11 10 |
| 76 | 1 00 11 00 | 1 10 10 10 |
| 77 | 1 00 11 01 | 1 10 10 11 |
| 78 | 1 00 11 10 | 1 10 10 01 |
| 79 | 1 00 11 11 | 1 10 10 00 |
| 80 | 1 01 00 00 | 1 11 10 00 |
| 81 | 1 01 00 01 | 1 11 10 01 |
| 82 | 1 01 00 10 | 1 11 10 11 |
| 83 | 1 01 00 11 | 1 11 10 10 |
| 84 | 1 01 01 00 | 1 11 11 10 |
| 85 | 1 01 01 01 | 1 11 11 11 |
| 86 | 1 01 01 10 | 1 11 11 01 |
| 87 | 1 01 01 11 | 1 11 11 00 |
| 88 | 1 01 10 00 | 1 11 01 00 |
| 89 | 1 01 10 01 | 1 11 01 01 |
| 90 | 1 01 10 10 | 1 11 01 11 |
| 91 | 1 01 10 11 | 1 11 01 10 |
| 92 | 1 01 11 00 | 1 11 00 10 |
| 93 | 1 01 11 01 | 1 11 00 11 |
| 94 | 1 01 11 10 | 1 11 00 01 |
| 95 | 1 01 11 11 | 1 11 00 00 |
| 96 | 1 10 00 00 | 1 01 00 00 |
| 97 | 1 10 00 01 | 1 01 00 01 |
| 98 | 1 10 00 10 | 1 01 00 11 |
| 99 | 1 10 00 11 | 1 01 00 10 |
| 100 | 1 10 01 00 | 1 01 01 10 |
| 101 | 1 10 01 01 | 1 01 01 11 |
| 102 | 1 10 01 10 | 1 01 01 01 |
| 103 | 1 10 01 11 | 1 01 01 00 |
| 104 | 1 10 10 00 | 1 01 11 00 |
| 105 | 1 10 10 01 | 1 01 11 01 |
| 106 | 1 10 10 10 | 1 01 11 11 |
| 107 | 1 10 10 11 | 1 01 11 10 |
| 108 | 1 10 11 00 | 1 01 10 10 |
| 109 | 1 10 11 01 | 1 01 10 11 |
| 110 | 1 10 11 10 | 1 01 10 01 |
| 111 | 1 10 11 11 | 1 01 10 00 |
| 112 | 1 11 00 00 | 1 00 10 00 |
| 113 | 1 11 00 01 | 1 00 10 01 |
| 114 | 1 11 00 10 | 1 00 10 11 |
| 115 | 1 11 00 11 | 1 00 10 10 |
| 116 | 1 11 01 00 | 1 00 11 10 |
| 117 | 1 11 01 01 | 1 00 11 11 |
| 118 | 1 11 01 10 | 1 00 11 01 |
| 119 | 1 11 01 11 | 1 00 11 00 |
| 120 | 1 11 10 00 | 1 00 01 00 |
| 121 | 1 11 10 01 | 1 00 01 01 |
| 122 | 1 11 10 10 | 1 00 01 11 |
| 123 | 1 11 10 11 | 1 00 01 10 |
| 124 | 1 11 11 00 | 1 00 00 10 |
| 125 | 1 11 11 01 | 1 00 00 11 |
| 126 | 1 11 11 10 | 1 00 00 01 |
| 127 | 1 11 11 11 | 1 00 00 00 |

What is claimed is:

1. A delay line, comprising:

a multi-tap delay circuit having a plurality of sequentially ordered output terminals; and a Gray code multiplexer having:
   a plurality of input terminals each coupled to one of the output terminals of the multi-tap delay circuit;
   a plurality of Gray code control terminals;
   a multiplexer tree having a first multiplexer level and a last multiplexer level; and
   an output terminal.

2. The delay line of claim 1, wherein the Gray code multiplexer is coupled to receive a Gray code value on the Gray code control terminals, the Gray code value selecting one of the input terminals.

3. The delay line of claim 1, wherein the last multiplexer level comprises a first multiplexer having a first input terminal and a second input terminal.

4. The delay line of claim 1, wherein the first multiplexer level comprises:

a second multiplexer having a plurality of sequentially ordered input terminals coupled to a first subset of the sequentially ordered output terminals of the multi-tap delay circuit; and a third multiplexer having a plurality of sequentially ordered input terminals reversedly coupled to a second subset of the sequentially ordered output terminals of the multi-tap delay circuit.

5. The delay line of claim 1, wherein the multiplexer tree further comprises a second multiplexer level and a third multiplexer level.

6. The delay line of claim 1, wherein the multiplexer tree further comprises a multiplexer tree controller coupled to convert the Gray code value into a plurality of tree select signals.

7. The delay line of claim 6, wherein the first multiplexer level comprises a plurality of multiplexers coupled to receive a first subset of the tree select signals; and the last multiplexer level comprises a multiplexer coupled to receive a second subset of the tree select signals.

8. The delay line of claim 6, wherein the multiplexer tree controller comprises a plurality of Gray code decoders.

9. The delay line of claim 1, further comprising a delay line controller coupled to the Gray code control terminals of the Gray code multiplexer.

10. The delay line of claim 9, wherein the delay line controller selects one of the input terminals of the Gray code multiplexer in response to a Gray code value.

11. The delay line of claim 9, wherein the delay line controller comprises:

a binary up/down counter; and a binary to Gray code converter coupled to the binary counter.

12. A Gray code multiplexer having a plurality of sequentially ordered input terminals and an output terminal, the Gray code multiplexer comprising:

a first multiplexer having a first input terminal, a second input terminal, and an output terminal coupled to the output terminal of the Gray code multiplexer;

a second multiplexer having an output terminal coupled to the first input terminal of the first multiplexer and a plurality of sequentially ordered input terminals coupled to a first subset of the sequentially ordered input terminals of the Gray code multiplexer; and a third multiplexer having an output terminal coupled to the second input terminal of the first multiplexer and a plurality of sequentially ordered input terminals reversedly coupled to a second subset of the sequentially ordered input terminals of the Gray code multiplexer.

13. The Gray code multiplexer of claim 12, wherein the first multiplexer further comprises a third input terminal and a fourth input terminal, and the Gray code multiplexer further comprises:

a fourth multiplexer having an output terminal coupled to the third input terminal of the first multiplexer and a plurality of sequentially ordered input terminals coupled to a third subset of the sequentially ordered input terminals of the Gray code multiplexer; and a fifth multiplexer having an output terminal coupled to the fourth input terminal of the first multiplexer and a plurality of sequentially ordered input terminals reversedly coupled to a fourth subset of the sequentially ordered input terminals of the Gray code multiplexer.

14. The Gray code multiplexer of claim 12, further comprising a multiplexer controller having a plurality of input terminals, a first plurality of output terminals coupled to the second and third multiplexers, and a second plurality of output terminals coupled to the first multiplexer.

15. The Gray code multiplexer of claim 14, wherein the multiplexer controller is coupled:

to receive a Gray code value on the input terminals of the multiplexer controller;

to generate a first plurality of select signals on the first plurality of output terminals; and to generate a second plurality of select signals on the second plurality of output terminals.

16. The Gray code multiplexer of claim 15, further comprising a Gray code multiplexer controller coupled to generate the Gray code value.

17. The Gray code multiplexer of claim 16, wherein the Gray code multiplexer comprises:

a binary up/down counter; and a binary to Gray code converter coupled to the binary counter.

* * * * *